(12) United States Patent
Gavagnin et al.

(10) Patent No.: US 11,430,703 B2
(45) Date of Patent: Aug. 30, 2022

(54) ALIGNING COMPONENT CARRIER STRUCTURE WITH KNOWN-GOOD SECTIONS AND CRITICAL SECTION WITH OTHER COMPONENT CARRIER WITH COMPONENTS AND DUMMIES

(71) Applicant: AT&S Austria Technologie & Systemtechnik Aktiengesellschaft, Leoben (AT)

(72) Inventors: Marco Gavagnin, Leoben (AT); Gernot Schulz, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/929,330

(22) Filed: Apr. 27, 2020

(65) Prior Publication Data

US 2020/0357706 A1 Nov. 12, 2020

(30) Foreign Application Priority Data

May 7, 2019 (EP) .................................... 19173014

(51) Int. Cl.
*H01L 21/66* (2006.01)
*H01L 21/48* (2006.01)
(Continued)

(52) U.S. Cl.
CPC .......... *H01L 22/20* (2013.01); *H01L 21/4867* (2013.01); *H01L 22/14* (2013.01);
(Continued)

(58) Field of Classification Search
CPC ......... H01L 22/14; H01L 22/22; H01L 22/30; H01L 21/78
See application file for complete search history.

(56) References Cited

U.S. PATENT DOCUMENTS

| 5,346,750 A | 9/1994 | Hatakeyama et al. |
| 5,481,795 A | 1/1996 | Hatakeyama et al. |
| (Continued) | | |

FOREIGN PATENT DOCUMENTS

| CN | 10384177 A | 6/2014 |
| CN | 103841771 A | 6/2014 |

OTHER PUBLICATIONS

Extended European Search Report in Application No. 19173014.2; dated Mar. 2, 2020; pp. 1-13; European Patent Office, 80298, Munich, Germany.

*Primary Examiner* — David A Zarneke
(74) *Attorney, Agent, or Firm* — Robert A. Blaha; Smith Tempel Blaha LLC

(57) ABSTRACT

A method of manufacturing component carriers includes carrying out a test for each of multiple sections of a component-carrier structure, inserting at least one functional component in each of further sections of a further component-carrier structure to be connected with the component-carrier structure so that each further section assigned to a respective section having successfully passed the test is provided with at least one functional component, and inserting at least one functionally inactive dummy component in each of the further sections assigned to a respective section having failed the test.

8 Claims, 4 Drawing Sheets

(51) Int. Cl.
  *H01L 23/31* (2006.01)
  *H01L 23/00* (2006.01)
  *B33Y 10/00* (2015.01)
  *B33Y 80/00* (2015.01)

(52) U.S. Cl.
  CPC .......... *H01L 23/3121* (2013.01); *H01L 24/24* (2013.01); *H01L 24/82* (2013.01); *H01L 24/96* (2013.01); *B33Y 10/00* (2014.12); *B33Y 80/00* (2014.12); *H01L 2224/2402* (2013.01); *H01L 2224/24011* (2013.01); *H01L 2224/82102* (2013.01); *H01L 2224/82104* (2013.01)

(56) References Cited

U.S. PATENT DOCUMENTS

| | | |
|---|---|---|
| 7,059,039 B2 | 6/2006 | Tsukamoto et al. |
| 9,098,646 B2 | 8/2015 | Bora et al. |
| 9,545,017 B2 | 1/2017 | Hunrath et al. |
| 9,941,207 B2 * | 4/2018 | Lin ................... H01L 23/528 |
| 2006/0168803 A1 | 8/2006 | Kanda et al. |
| 2007/0134849 A1 | 6/2007 | Vanfleteren et al. |
| 2009/0114338 A1 | 5/2009 | Kawakita et al. |
| 2009/0229862 A1 | 9/2009 | Nakamura et al. |
| 2010/0230145 A1 | 9/2010 | Holcomb |
| 2016/0118332 A1 | 4/2016 | Lin |
| 2016/0118333 A1 | 4/2016 | Lin |

* cited by examiner

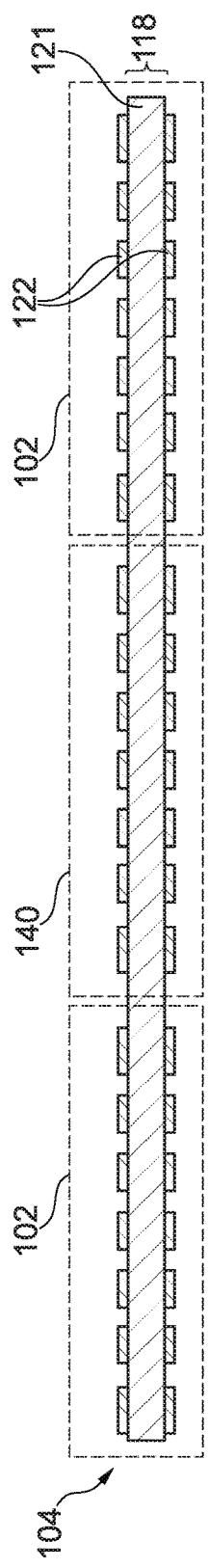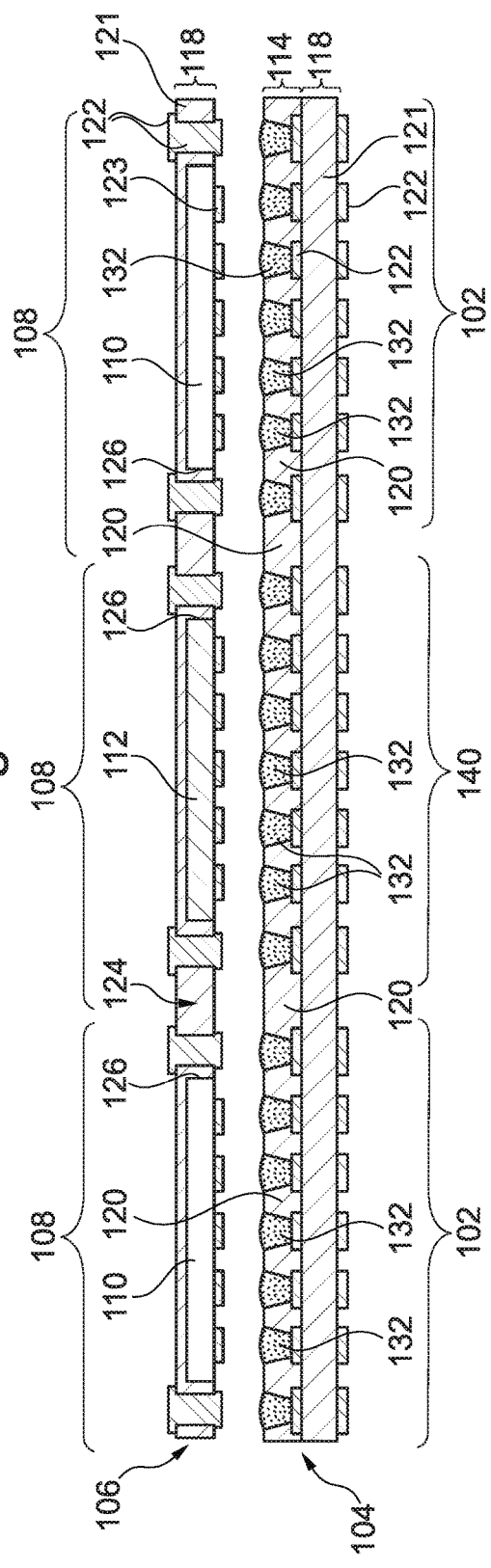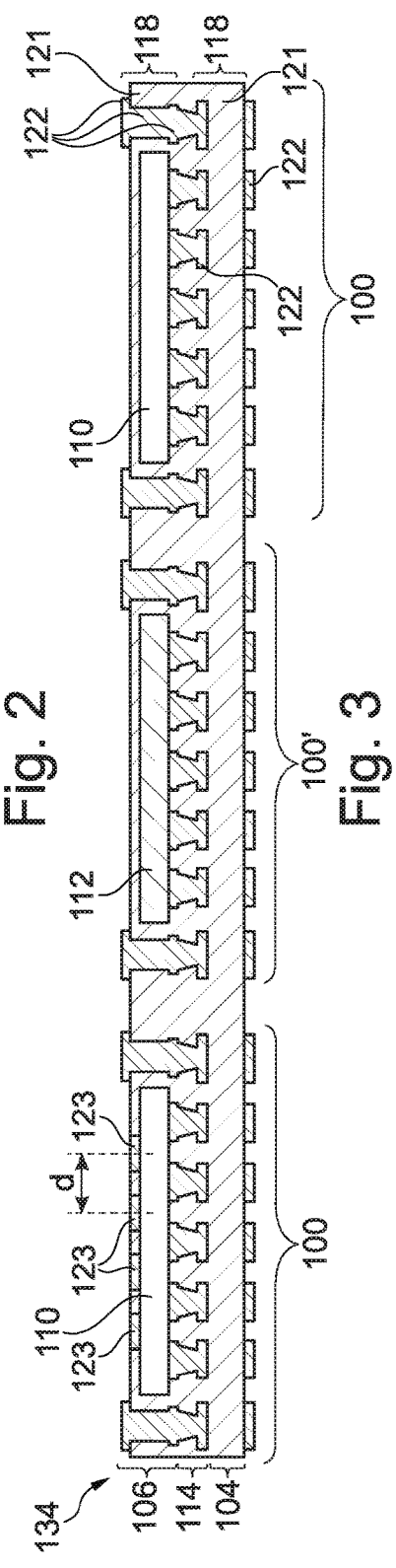

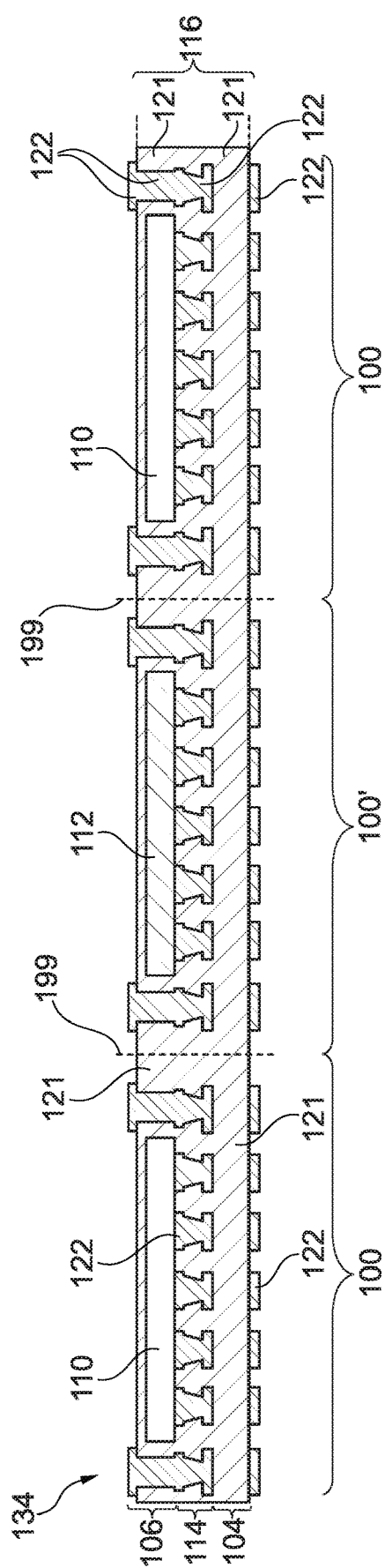
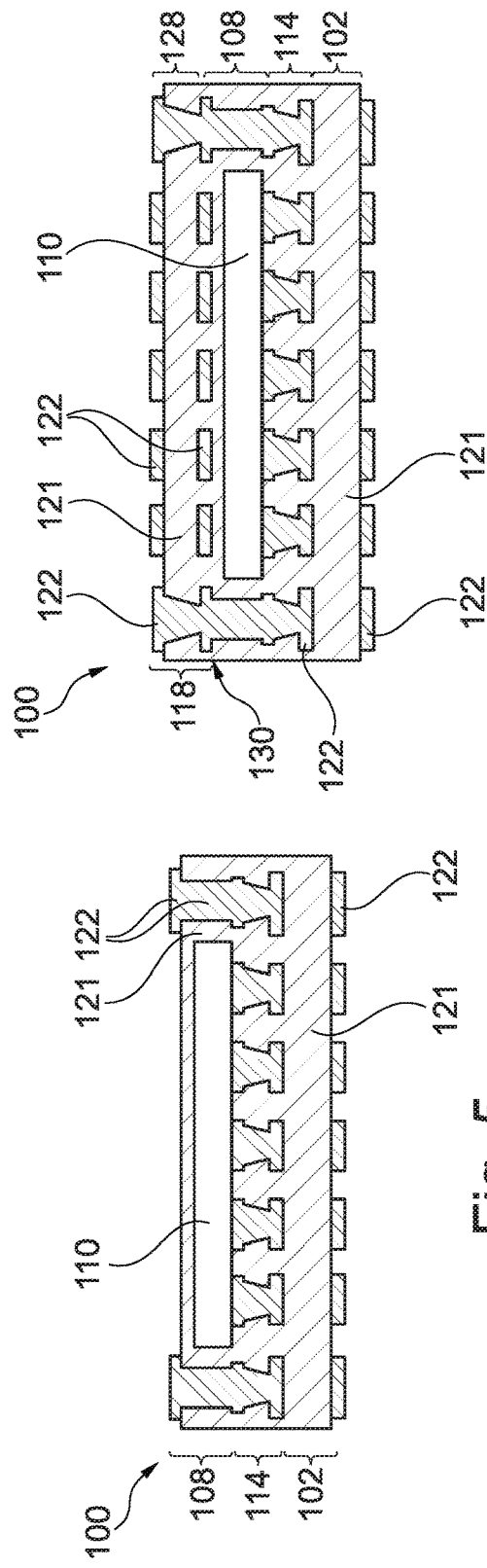
Fig. 4
Fig. 5
Fig. 6

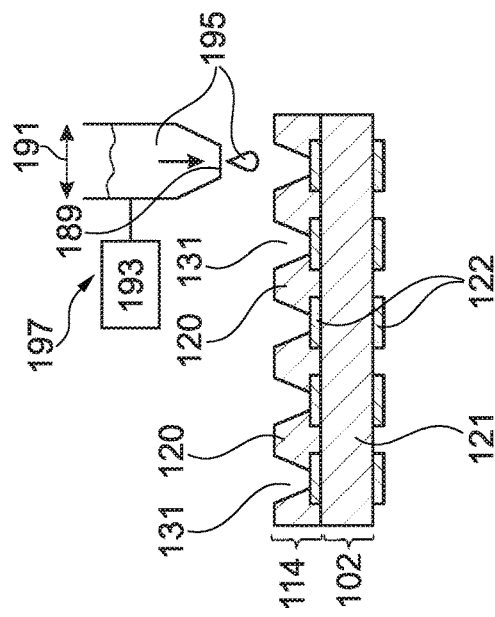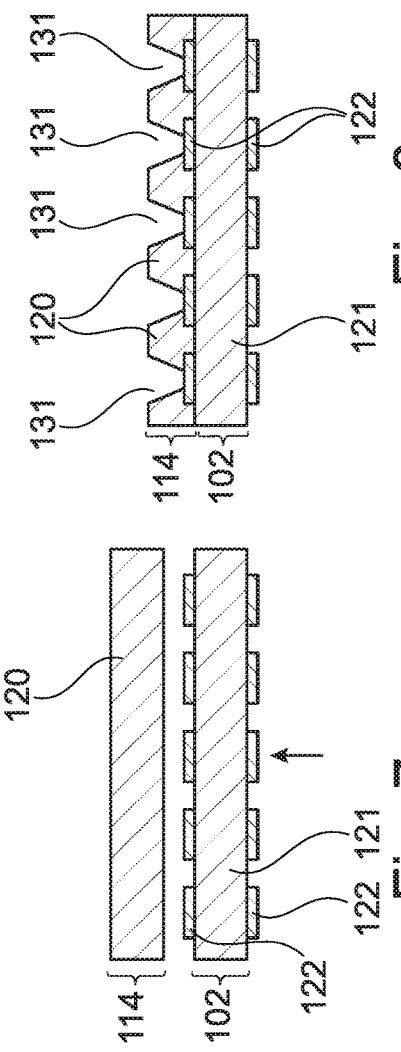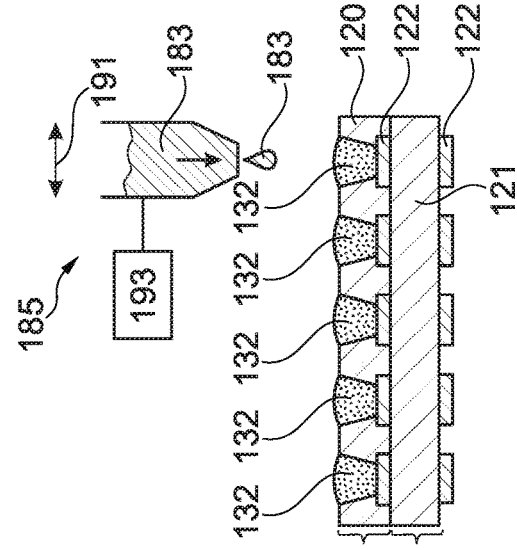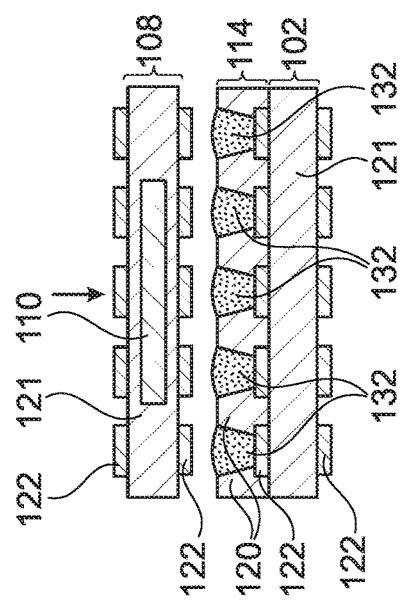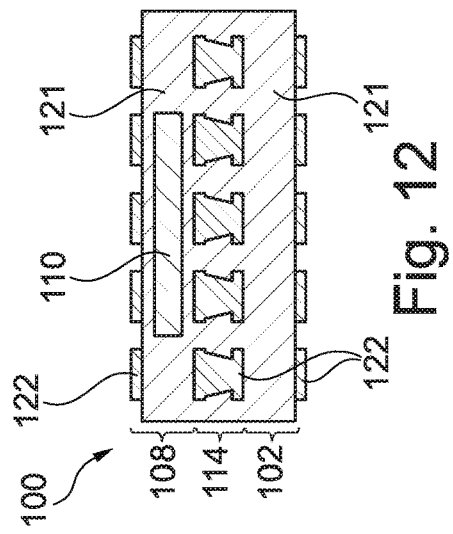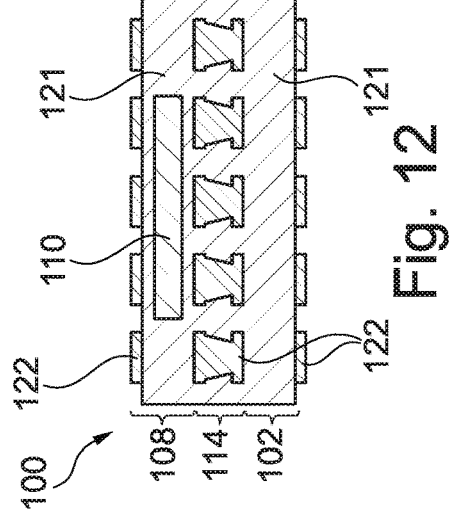

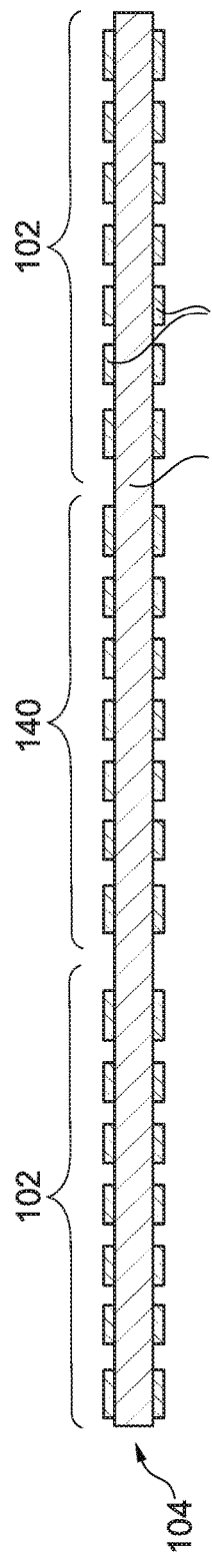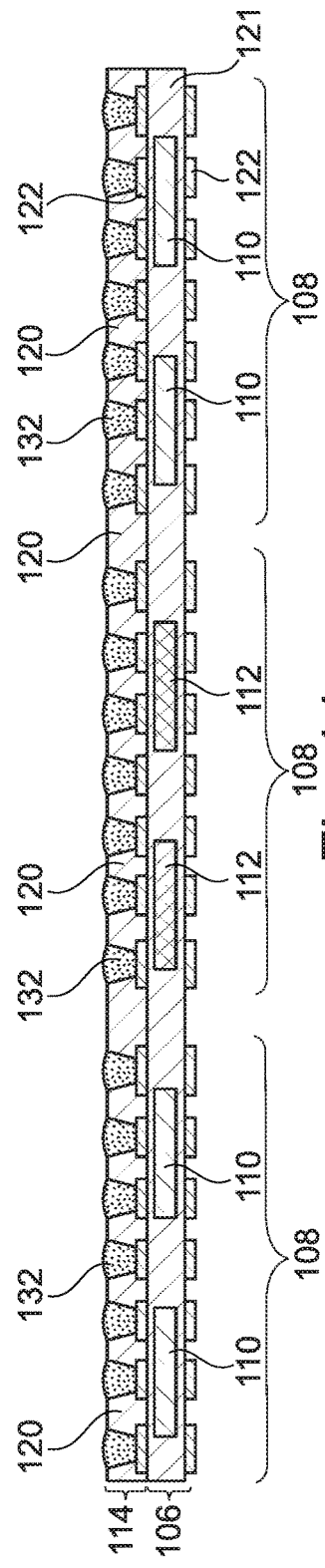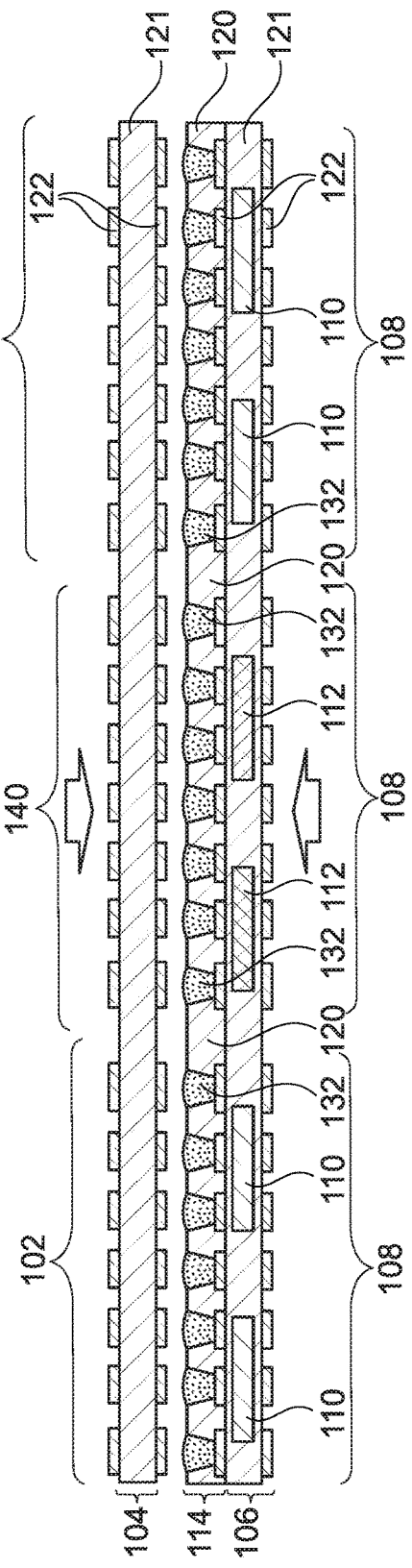

ALIGNING COMPONENT CARRIER STRUCTURE WITH KNOWN-GOOD SECTIONS AND CRITICAL SECTION WITH OTHER COMPONENT CARRIER WITH COMPONENTS AND DUMMIES

CROSS-REFERENCE TO RELATED APPLICATION

This application claims the benefit of the filing date of the European Patent Application No. 19 173 014.2, filed May 7, 2019, the disclosure of which is hereby incorporated herein by reference.

TECHNICAL FIELD

Embodiments of the invention relate to methods of manufacturing component carriers, a semifinished product, a component carrier, a computer-readable medium, and a program element.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed-circuit boards, increasingly more powerful array-like components or packages having several electronic components are being employed, which have a plurality of contacts or connections, with ever smaller spacing between these contacts. Removal of heat generated by such electronic components and the component carrier itself during operation becomes an increasing issue. At the same time, component carriers shall be mechanically robust and electrically and magnetically reliable so as to be operable even under harsh conditions.

Moreover, yield loss in component carrier manufacturing including embedded components is an issue. This is in particular important when valuable components, such as a microprocessor chip, are to be connected electrically with other constituents of a component carrier.

US 2009/229862 A1 discloses that a plurality of double-sided boards using a film are attached to each other with a paste coupling layer sandwiched therebetween. In the paste coupling layer, a conductive paste is filled into a through hole formed in provisionally hardened resin, which is hardened. At the same time, second wirings are electrically coupled to each other by using the hardened conductive paste filled in the through holes that have been previously formed in the paste coupling layer.

SUMMARY

There may be a need to reliably embed a component in a component carrier with high yield.

According to exemplary embodiments, methods of manufacturing component carriers, a semifinished product, and a component carrier according to the independent claims are provided.

According to an exemplary embodiment of the invention, a method of manufacturing component carriers is provided, wherein the method comprises carrying out a test for each of multiple sections of a component-carrier structure, inserting at least one functional component in each of further sections of a further component-carrier structure to be connected with the component-carrier structure so that each further section assigned to a respective section having successfully passed the test is provided with at least one functional component, and inserting at least one functionally inactive dummy component in each of the further sections assigned to a respective section having failed the test.

According to another exemplary embodiment of the invention, a semifinished product obtainable or obtained during manufacturing component carriers is provided, wherein the semifinished product comprises a component-carrier structure comprising a plurality of functional sections and at least one non-functional section, a further component-carrier structure connected with the component-carrier structure and comprising a plurality of further sections, functional components each of which being inserted in a respective one of the further sections so that each further section assigned to a respective functional section is provided with at least one of the functional components, and at least one functionally inactive dummy component inserted in a respective one of the further sections so that each further section assigned to a respective non-functional section is provided with at least one dummy component.

According to another exemplary embodiment of the invention, a component carrier is provided, wherein the component carrier comprises a component-carrier section, a further component-carrier section, a functional component embedded in the further component-carrier section, and an additively manufactured (in particular a printed) connection structure by which the component-carrier section and the further component-carrier section are connected.

According to yet another exemplary embodiment of the invention, a method of manufacturing a component carrier is provided, wherein the method comprises providing a component-carrier section of a component-carrier structure and a further component-carrier section of a further component-carrier structure being separate from said component-carrier structure, embedding a functional component in the further component-carrier section, forming by additive manufacturing (in particular printing) a connection structure on at least one of the component-carrier section and the further component-carrier section, and connecting the component-carrier structure with the further component-carrier structure so that the component-carrier section and the further component-carrier section are connected by the connection structure formed by additive manufacturing (in particular printing).

According to still another exemplary embodiment of the invention, a program element (for instance a software routine, in source code or in executable code) is provided, which, when being executed by a processor (such as a microprocessor or a CPU), is adapted to control or carry out a method having the above mentioned features.

According to yet another exemplary embodiment of the invention, a computer-readable medium (for instance a CD, a DVD, a USB stick, an SD card, a floppy disk or a hard disk, or any other (in particular also smaller) storage medium) is provided, in which a computer program is stored which, when being executed by a processor (such as a microprocessor or a CPU), is adapted to control or carry out a method having the above mentioned features.

OVERVIEW OF EMBODIMENTS

Data processing which may be performed according to embodiments of the invention can be realized by a computer program, that is by software, or by using one or more special electronic optimization circuits, that is in hardware, or in hybrid form, that is by means of software components and hardware components.

In the context of the present application, the term "component carrier" may particularly denote any support structure which is capable of accommodating one or more (electronic) components thereon and/or therein for providing mechanical support and/or electrical connectivity. In other words, a component carrier may be configured as a mechanical and/or electronic carrier for components. In particular, a component carrier may be one of a printed-circuit board, an organic interposer, and an IC (integrated circuit) substrate. A component carrier may also be a hybrid board combining different ones of the above-mentioned types of component carriers.

In the context of the present application, the term "component-carrier structure" may particularly denote a preform of part of multiple component carriers as obtained during manufacturing component carriers. For instance, a component-carrier structure may be a panel integrally comprising multiple preforms of component carriers being presently manufactured. It is also possible that such a panel is separated into multiple arrays (for instance into four quarter panels), wherein each array comprises multiple preforms of component carriers being presently manufactured. Such a panel or array may be a layer stack of multiple electrically-conductive layer structures and/or electrically-insulating layer structures, which may or may not have cavities and which may or may not be fully cured or at least partially uncured. A component-carrier structure may particularly be any body (in particular layer stack) which may be used during the manufacture of component carriers and which may form part of a readily manufactured component carrier or multiple readily manufactured component carriers.

In the context of the present application, the term "assigning" sections of the component-carrier structures to be connected may particularly denote that the assigned sections are spatially assigned so as to face each other in a semifinished product composed of the component-carrier structures. After singularization of the semifinished product, a corresponding functionally active or inactive component carrier may comprise the assigned sections.

In the context of the present application, the term "test" of sections of a component-carrier structure may particularly denote a functional test of the respective section. Such a test may be an electric test during which at least one electric stimulus signal is applied to an electrically-conductive layer structure of the section and at least one electric response signal is detected being indicative of whether the section electrically functions or not. However, the test can be, additionally or alternatively, also a mechanical test testing the robustness, warpage properties, etc. of the section. Also, a visual inspection is possible.

In the context of the present application, the term "connection structure" may particularly denote any medium capable of connecting different component-carrier structures with one another so as to obtain a common-integral body.

In the context of the present application, the term "component" may particularly denote any body, in particular having an electronic and/or thermal and/or mechanical function, being embedded in or surface-mounted on a layer stack, component-carrier structure or component carrier. In particular, the component may be of a non-layer type, i.e. may not be as flat as the layer structures forming the stack. For instance, the component may extend vertically over multiple layer structures of a stack. In embodiments, the component may be made of a material at least partially deviating from component-carrier material. For example, the component may be a semiconductor chip.

In the context of the present application, the term "functional component" may particularly denote a component which is capable of fulfilling a specific, in particular electronic or thermal, function. For instance, such a functional component may be a semiconductor chip fulfilling a certain electronic function. Furthermore, a functional component may be a semiconductor package, i.e. bare die encapsulated in epoxy-mold compound, fulfilling a certain electronic function. It is however also possible that the functional component is a copper block for cooling purposes. For example, the functional component may have already successfully passed a functioning test during which it has been successfully tested that the functional component is intact and thus capable of providing the assigned function.

In the context of the present application, the term "dummy component" may particularly denote a physical body without function in terms of a component carrier. Thus, such a dummy component may be simply a place-holder filling a cavity or recess of a component-carrier structure for avoiding problems during processing (in particular lamination) which might arise if the cavities would not be filled by a functional component or a dummy component. However, the dummy component may be incapable of providing any function or at least the function provided by the functional components. For instance, a dummy component may be a body (for instance of plastic or silicon) being functionally inactive in a semifinished product or a readily manufactured component carrier. In particular, the dummy component may be incapable of providing any electric function. For example, the dummy component may simply emulate the shape of a functional component. In other words, the dummy component may be shaped and dimensioned as a functional component however without providing the function of the functional component. It is also possible that the dummy component is a non-functional component, i.e. is a component which has however failed to pass a functioning test before being inserted in cavities of the further component-carrier structure.

In the context of the present application, the term "known-good" may particularly denote that a structure (such as a layer stack, a cavity, a component or a component carrier) being considered for manufacturing a component carrier or a system of multiple component carriers has already previously, i.e. before using, mounting or assembling the respective constituent, been successfully tested concerning its qualification to contribute to the formation of a failure-free component carrier or system and has therefore successfully passed such a test. In particular, such a test may be a quality test testing this qualification. The quality test may test as to whether the respective structure fulfills a predefined specification, is within a predefined range of tolerances, and/or complies with a predefined functional requirement. Such a quality test may be an electric test which may for instance involve applying an electric stimulus signal and measuring an electric response signal which must fulfill certain conditions in order to consider the respective structure to have passed the test. Such a test may, additionally or alternatively, be also an inspection (for instance an optical inspection) measuring shape and/or dimension of a respective structure as at least part of the test. In an embodiment, only if an individually tested structure has passed the test, it is classified as "known-good" structure, whereas it can be classified as "not known-good" if the structure fails to pass the test. Upon failing such a test, the respective structure may for instance be disposed as waste, or may be made subject to a repair or post-processing procedure or may be used for another purpose.

In the context of the present application, the term "layer stack" may particularly denote a stack of multiple planar-layer structures being connected to one another. In particular, such layer structures may be electrically-insulating layer structures and/or electrically-conductive layer structures. The term "layer structure" may particularly denote one of a continuous layer, a patterned layer and an arrangement of multiple connected and/or non-connected islands within one plane. For instance, such a layer structure may be a continuous foil or sheet, whereas such a foil or sheet may also be patterned. The layer structures or the stack as a whole may comprise component-carrier material, i.e. material used for electrically-conductive structures or electrically-insulating structures of a component carrier such as a printed-circuit board or an IC substrate. The individual layer structures of the stack may be connected in particular by lamination, i.e. the application of heat and/or pressure.

In the context of the present application, the term "additive manufacturing" may particularly denote a manufacturing procedure of a connection structure according to which the connection structure is manufactured by the addition of material (in particular sequential addition of portions of material) which constitute the connection structure. Additive manufacturing may in particular encompass printing, more particularly three-dimensionally printing. By additive manufacturing, it is for instance possible to apply the connection structure in form of a paste.

According to an exemplary embodiment of the invention, a high-yield manufacturing method for multilayer-component carriers with embedded component is provided in which a component-carrier structure is connected with a further component-carrier structure. Advantageously, functional components can be only inserted in sections of the further component-carrier structure which will be connected with a known-good section of the component-carrier structure. In other words, before inserting a functional component in a cavity of a further section of the further component-carrier structure to be connected with a section of the component-carrier structure, a successful test is completed indicating that said section of the component-carrier structure functions properly. By taking this measure, it can be ensured that the—in many cases very expensive—functional components are only used for those further sections of a semifinished product in form of the connected component-carrier structures in which also the counterpart section is known-good. However, in order to guarantee processing of the component-carrier structures without reliability issues, also cavities in further sections of the further component-carrier structure which correspond to or are assigned to sections of the component-carrier structure having failed the test are filled with dummy components mimicking a respective functional component without requiring to fulfil a functional component's function. In other words, by filling these cavities with non-functional dummy components, a proper quality of the semifinished product may be guaranteed, so that a proper mechanical integrity of even such inactive portions of the semifinished product can be ensured. This results from the fact that the presence of dummy components (in comparison with empty voids or cavities) provides a homogeneous construction of the component-carrier structures and avoids undesired phenomena such as warpage. By suppressing such undesired phenomena, the reliability of the manufactured component carriers may be improved. By taking this measure, a high yield of functionally active component carriers singularized from the semifinished product can be synergistically combined with a proper processability of the semifinished product during the manufacturing process.

Thus, a gist of an exemplary embodiment of the invention may be the recombination, in z-direction, of a fully tested circuit board, as first component-carrier structure, with an embedded core circuit board, as second component-carrier structure, having known-good components placed according to the known-good component-carrier sections of the first component-carrier structure. In particular a combination of a fully tested core with a fully tested PCB may allow for a high-yield production. By taking this measure, a die-last embedding technology may be provided which allows obtaining specifically pronounced advantages where fan-out or formation of a redistribution layer is assembled last. In particular the combination of a z-interconnection method and a layer with embedded components may be advantageous in order to match the known-good component-carrier sections with known-good components. Combining pre-tested electronic blocks (for example HDI (high-density integration) and embedded cores) can bring substantial advantages in terms of higher yield, hence, costs.

In a preferred embodiment, a dielectric layer of a connection structure for z-interconnection may be formed by additive manufacturing, in particular may be printed (for instance screen printed, inkjet printed, etc.). During such a printing procedure, openings (for instance via-like openings) may be formed in which conductive layers may be printed/dispensed or formed by another additive manufacturing process. In particular, one or more printed-dielectric sheets with openings in which conductive layers may be printed and/or dispensed may be provided as vias for z-interconnection. However, also other additive manufacturing processes may be applied for forming the connection structure or part thereof.

In the following, further exemplary embodiments of the methods, the semifinished product, the component carrier, the computer-readable medium, and the program element will be explained.

In particular referring to the computer-readable medium and the program element, a corresponding software may provide a traceability and data-analytics function to enable the method according to exemplary embodiments of the invention as well as communication in between involved machinery. Assembling of components, manufacturing a component-carrier structure with functional components therein, etc., may be processed by referring to stored (in particular emap, etest, imaging, test and/or other) data. Known-good components and/or dummies may then be chosen accordingly. In particular, such a software may also control or carry out a measurement of shape and/or dimension of a respective structure as at least part of the above-mentioned test.

In particular, an exemplary embodiment of the invention provides a method of combining known-good electronic components. The recombination or assembly of two or more component-carrier structures, for instance two PCBs (printed-circuit boards), may the obtained using (i) copper paste for establishing conductive paths in z-direction and (ii) a B-stage (i.e. not fully cured) resin sheet for mechanical adhesion, both in between the two component-carrier structures. For example, the mentioned PCB can be a substrate, a PCB with embedded component, a core with embedded components, etc.

In an embodiment, the component-carrier structure is a panel, or an array comprising multiple preforms of component carriers. In the context of the present application, the term "panel" may particularly denote a planar-layer stack of at least one electrically-insulating layer structure and/or at least one electrically-conductive layer structure and having a format capable of manufacturing multiple component carriers. For instance, such a panel may have an area of 18×12 inches$^2$, or larger. By manufacturing multiple component carriers on panel level, a highly efficient batch procedure with a high throughput can be ensured. Thereby, many component carriers can be manufactured in an efficient way. An array may be a portion of a panel including multiple preforms of component carrier in a block.

In an embodiment, the further component-carrier structure is a core having cavities in which the functional components and the dummy components are embedded. In the context of the present application, the term "core" may particularly denote a fully-cured layer stack made of component-carrier material. For instance, such a core may be made of FR4 material, optionally in combination with copper structures. When such a core is made of a fully-cured material, formation of cavities in the core is possible without the risk of resin flowing into the cavities during a lamination procedure. The cavities may be sized and shaped so as to be capable of accommodating functional components or dummy components.

In an embodiment, the method comprises connecting the component-carrier structure with the further component-carrier structure by a connection structure. Thus, a layer stack with multiple layers can be formed by connecting the two component-carrier structures with one another via the connection structure. The connection structure may establish a mechanical connection between the component-carrier structure and the further component-carrier structure. It is however also possible that the connection structure additionally provides an electric connection between electrically-conductive structures of the connected component-carrier structures. For instance, such an electric connection may form an electrically-conductive path from a functional component in the further component-carrier structure into the component-carrier structure. It has turned out that the yield of manufacturing component carriers with multiple-layer structures is higher when connecting two (or more) component-carrier structures each comprising a respective layer stack as compared to a build-up of a single layer stack by continued lamination or the like. A reason for this is that the individual component-carrier structures may be tested individually before connection so that the risk of failure can be rendered smaller as compared to a single multilayer build-up which is only tested at the very end of the manufacturing procedure. For instance, each of the component-carrier structures connected by the connection structure may have at least 6, in particular at least 10, more particularly at least 14-layer structures, thereby enabling to form component carriers of a very high number of layer structures with high yield.

In an embodiment, the method comprises printing the connection structure on one or both of the component-carrier structure and the further component-carrier structure. As an alternative to printing, all embodiments described in the present application may be applied to other additive manufacturing processes as well. Highly advantageously, the connection structure may be printed on the respective component-carrier structure. By printing the connection structure rather than patterning a laminated-connection layer, it is possible with low effort to provide material (in particular electrically-insulating material) of the connection structure only where it is desired for disabling an electric connection between the component-carrier structures to be connected via the connection structure. A cumbersome patterning procedure (for instance lithographically, by etching and/or by laser processing) can therefore be dispensable, while simultaneously providing a high freedom of design. Furthermore, printing not only allows defining electrically-insulating regions of the connection structure (for instance by applying dielectric adhesive). In contrast to this, it is also possible that electrically-conductive regions are defined by printing (for instance by printing an electrically-conductive paste on desired portions of a respective one of the component-carrier structures). After having applied the connection structure to one or both of the component-carrier structures to be connected by the connection structure, it is possible to carry out the connection procedure, for instance by lamination, curing, adhering, etc.

In an embodiment, the printing comprises one of the group consisting of ink jetting, screen printing, and dispensing. Such a printing procedure may be carried out by a medium-supply device providing the medium of the connection structure. Such embodiments of the invention may be implemented with various kinds of medium-supply devices such as dispensing devices, screen-printing devices, inkjet devices, aerosol-jet devices, etc. However, other printing techniques can be applied as well. The mentioned medium-supply device may be configured for supplying material of the connection structure. In certain embodiments, any appropriate liquid, solid, aerosol, etc. medium can be applied to a connection surface of the respective component-carrier structure.

In an embodiment, the medium-supply device is a dispenser. A dispenser may comprise a tubular member with a hollow lumen through which medium to be dispensed or applied can be transported. At an open flange face of an end section of such a dispenser, the medium may pass out of the tubular member onto a surface portion of the respective component-carrier structure.

In another embodiment, the medium-supply device is a screen-printing device. A screen-printing device may comprise a screen with at least one through hole as medium-supply opening through which medium to be dispensed or applied can be transported. At least part of the screen may be placed on the connection surface of the respective component-carrier structure to partially cover the latter. Subsequently, medium to be applied may be supplied from an upper side of the screen and may pass at one or more defined positions through the at least one through hole (which may define a pattern according to which the medium shall be applied to only selective surface portions of the cavity wall). A squeegee may then move over the screen to promote passage of medium through the at least one through hole and to remove excessive medium from an upper side of the screen.

In an embodiment, the printed-connection structure is free of a reinforcing structure, in particular free of reinforcing particles or reinforcing fibers. For instance, reinforcing glass fibers or glass spheres may not form part of the printed-connection structure. Thus, the material of the printed-connection structure may be different from prepreg or FR4 being applied as a layer of resin with reinforcing particles therein. In contrast to this, the printed-connection structure may for instance consist of resin or other materials such as epoxy derivatives which do not comprise a reinforcing structure.

In another embodiment, the method comprises laminating the connection structure, made of an at least partially uncured material, on one of the component-carrier structure and the further component-carrier structure so that the connection structure remains at least partially uncured after the laminating, and subsequently laminating together, by the connection structure, the component-carrier structure and the further component-carrier structure.

In particular, the method may comprise substantially fully curing (in particular fully curing) the connection structure by the subsequent lamination. As known by a person skilled in the art, the polymer chains are highly cross-linked during curing so that the final component carrier cannot be thermally reformed. However, a person skilled in the art is aware of the fact that even a substantially full curing does not need to correspond to exactly 100% cross-linking. Thus, as an alternative to printing, the connection structure may also be formed by soft lamination (i.e. lamination which does not fully cure the material of the connection structure) followed by an optional patterning of a layer forming the connection structure. During connecting the component-carrier structures for forming an integral structure, the material of the connection structure may then be fully cured. Lamination may be carried out by applying thermal energy and/or mechanical pressure.

In an embodiment, the method comprises connecting another component-carrier structure with the component-carrier structure and the further component-carrier structure by another connection structure (wherein the other connection structure may be configured in accordance with any of the embodiments described above for the connection structure connecting the component-carrier structure with the further component-carrier structure). Thus, the stacking architecture according to an exemplary embodiment of the invention may be continued by, subsequently or simultaneously, connecting at least one further component-carrier structure to the component-carrier structure and the further component-carrier structure. Therefore, even highly-complex component carriers with a high number of layer structures may be formed. Preferably, individual sections of the other component-carrier structure may be functionally tested before connecting it to the component-carrier structure and the further component-carrier structure. In particular, individual sections of the other component-carrier structure assigned with the sections of the component-carrier structure and the further sections of the further component-carrier structure may be functionally tested before the connection. In an embodiment, only sections of the component-carrier structure and assigned sections of the other component-carrier structure which have successfully passed the functional tests may then be connected with a corresponding further section of the further component-carrier structure in which a functional component is embedded. If any of the mentioned sections turns out as functionally problematic, the respective cavity in the assigned further section of the further component-carrier structure may be filled with a dummy component instead of filling it with a functional component.

In particular, the further component-carrier structure may be arranged between the component-carrier structure and the other component-carrier structure. With such an embodiment, the one or more functional components may be embedded deeply in an interior of a multilayer stacked component carrier.

In an embodiment, the method comprises separating a semifinished product obtained by connecting the component-carrier structure with the further component-carrier structure into individual component carriers each comprising one of the sections and a one of the further sections and one of a functional component or a dummy component.

Also, a portion of the connection structure may form part of each component carrier. The separated sections comprising a functional component may then be used as readily manufactured component carriers. In contrast to this, the obtained singularized bodies having a dummy component only will not be used as component-carrier structures. They may be considered as waste or may be further processed to recover the embedded dummy component for further procedures. However, the loss of functional components due to functionally-problematic connected sections may be significantly reduced, or even eliminated.

In an embodiment, the method comprises providing the connection structure as a patterned electrically-insulating layer structure (in particular comprising at least partially uncured resin) having at least one recess filled with an electrically-conductive material (in particular copper paste). By configuring the connection structure to have both electrically-insulating regions (for instance used for mechanical connection purposes and for electrically-insulating surface portions of the connected component-carrier structures) and electrically-conductive regions (for instance used for electric connection purposes between the connected component-carrier structures in vertical direction), the component-carrier structures to be connected can also be electrically coupled without taking any further measures.

In an embodiment, the method comprises treating the component carriers comprising a dummy component as waste. However, the dummy components may also be recycled from these non-functional component carriers.

In an embodiment, the method comprises carrying out a test for each of the functional components before the inserting, and inserting the functional components in a respective one of the further sections only for those functional components having passed the testing. When testing the functional components before inserting them into the cavities in the further sections of the further component-carrier structure, it can be safely prevented that sections of the component-carrier structure which have been successfully tested before the connection between the component-carrier structures are lost because of a functional inactivity of the respective functional component. Thus, by using only known-good functional components when embedding them in a respective cavity of the further component-carrier structure, the yield may be further increased and the waste may be further decreased.

In an embodiment, each of the component-carrier structure and the further component-carrier structure comprises a stack comprising at least one electrically-insulating layer structure and/or at least one electrically-conductive layer structure. This allows connecting multiple multi-layer stacks with one another to form component carriers having a high-layer count.

In an embodiment, the component carrier comprises a stack of at least one electrically-insulating layer structure and at least one electrically-conductive layer structure. For example, the component carrier may be a laminate of the mentioned electrically-insulating layer structure(s) and electrically-conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded-electronic component, can be conveniently embedded, thanks to its small thickness, into a thin plate such as a printed-circuit board.

In an embodiment, the component carrier is configured as one of the group consisting of a printed-circuit board, a substrate (in particular an IC substrate), and an interposer.

In the context of the present application, the term "printed-circuit board" (PCB) may particularly denote a plate-shaped component carrier which is formed by laminating several electrically-conductive layer structures with several electrically-insulating layer structures, for instance by applying pressure and/or by the supply of thermal energy. As preferred materials for PCB technology, the electrically-conductive layer structures are made of copper, whereas the electrically-insulating layer structures may comprise resin and/or glass fibers, so-called prepreg or FR4 material. The various electrically-conductive layer structures may be connected to one another in a desired way by forming through-holes through the laminate, for instance by laser drilling or mechanical drilling, and by filling them with electrically-conductive material (in particular copper), thereby forming vias as through-hole connections. Apart from one or more components which may be embedded in a printed-circuit board, a printed-circuit board is usually configured for accommodating one or more components on one or both opposing surfaces of the plate-shaped printed-circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed-circuit board (PCB), however with a considerably higher density of laterally and/or vertically-arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed-circuit board or intermediate printed-circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically-insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR4 or FR5), polyimide, polyamide, liquid crystal polymer (LCP), epoxy-based build-up film, polytetrafluoroethylene (Teflon®), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film for substrates may be used as well. For high-frequency applications, high-frequency materials such as polytetrafluoroethylene, liquid-crystal polymer and/or cyanate-ester resins, low-temperature cofired ceramics (LTCC) or other low, very-low or ultra-low DK materials may be implemented in the component carrier as electrically-insulating layer structure.

In an embodiment, at least one of the electrically-conductive layer structures comprises at least one of the group consisting of copper, aluminum, nickel, silver, gold, palladium, and tungsten. Although copper is usually preferred, other materials or coated versions thereof are possible as well, in particular coated with supra-conductive material such as graphene.

At least one functional component may embedded in the component carrier and can in particular be selected from a group consisting of an electrically non-conductive inlay, an electrically-conductive inlay (such as a metal inlay, preferably comprising copper or aluminum), a heat transfer unit (for example a heat pipe), a light-guiding element (for example an optical waveguide or a light-conductor connection), an electronic component, or combinations thereof. For example, the component can be an active-electronic component, a passive-electronic component, an electronic chip, a storage device (for instance a DRAM or another data memory), a filter, an integrated circuit, a signal-processing component, a power-management component, an optoelectronic-interface element, a light-emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy-harvesting unit. However, other components may be embedded in the component carrier. For example, a magnetic element can be used as a component. Such a magnetic element may be a permanent-magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. A component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple-layer structures which are stacked and connected together by applying a pressing force and/or heat.

BRIEF DESCRIPTION OF THE DRAWINGS

The aspects defined above and further aspects of the invention are apparent from the examples of embodiment to be described hereinafter and are explained with reference to these examples of embodiment.

FIG. 1, FIG. 2, FIG. 3 to FIG. 4 illustrate cross-sectional views of structures obtained during carrying out a method of manufacturing component carriers according to an exemplary embodiment of the invention.

FIG. 5 illustrates a cross-sectional view of a component carrier according to an exemplary embodiment of the invention.

FIG. 6 illustrates a cross-sectional view of a component carrier according to another exemplary embodiment of the invention.

FIG. 7, FIG. 8, FIG. 9, FIG. 10, FIG. 11 to FIG. 12 show cross-sectional views of structures obtained during carrying out a method of manufacturing component carriers according to an exemplary embodiment of the invention.

FIG. 13, FIG. 14 to FIG. 15 show cross-sectional views of component-carrier structures connected during carrying out a method of manufacturing component carriers according to an exemplary embodiment of the invention.

DETAILED DESCRIPTION OF EXEMPLARY EMBODIMENTS

The illustrations in the drawings are schematically presented. In different drawings, similar or identical elements are provided with the same reference signs.

Before referring to the drawings, exemplary embodiments will be described in further detail, some basic considerations will be summarized based on which exemplary embodiments of the invention have been developed.

According to an exemplary embodiment of the invention, a method of combining known-good component-carrier structures is provided. With such a manufacturing architecture, the total yield of highly-complex component-carrier systems can be significantly increased compared to conventional approaches. In an embodiment, a die-last embedding architecture may be implemented, in particular where a fan-out structure or a redistribution layer is assembled last. Moreover, a high-layer count board recombination may be achieved, for instance based on advanced HDI (high-density interconnect) technology.

A recombination or reassembly of two electronic components, i.e. two printed-circuit boards (PCBs) can be carried out. Such a PCB can also be an IC (integrated circuit) substrate, a PCB with embedded component, a core with embedded component, etc.

In an embodiment, copper paste may be used in a connection structure between different component-carrier structures for establishing conductive paths in vertical direction. It is also possible to use an at least partially uncured electrically-insulating layer structure (such as a B-stage resin sheet) for mechanical adhesion between multiple component-carrier structures, i.e. in between the electronic component-carrier structures.

A yield improvement obtainable according to exemplary embodiments of the invention may be described as follows: In case of high-layer count PCBs, each additional layer (where the yield is not 100%) may lead to waste, what concerns full cards realized with the previous lay-up. Therefore, it is to be expected that manufacturing (for example) a 28-layer PCB by subsequent lamination procedures may lead to a lower yield compared to combining two 14-layer PCBs together.

According to an exemplary embodiment of the invention, it may thus be possible to combine in a vertical direction a fully-tested component-carrier structure, such as a printed-circuit board, with a further embedded core component-carrier structure having known-good functional components placed according to the known-good parts in the first mentioned component-carrier structure.

Advantageously, a dielectric-connection layer providing a vertical interconnection between the two mentioned component-carrier structures may be printed (for instance screen printed, printed by inkjet, etc.). Openings (for instance via-like openings) may be left where the conductive layers may be printed or dispensed.

According to an exemplary embodiment of the invention, the production of a high-layer count component carrier is carried out by a recombination of two or more component-carrier structures. For instance, a PCB structure with embedded components may be combined with a further PCB structure for interconnection purposes. A significant advantage which may be obtained by such a concept is to thoroughly test one PCB structure before lamination with the other PCB structure in order to identify possible failure zones. Therefore, identifying defect units on the whole panel is possible. Once this is executed, an embedded core containing known-good (i.e. fully tested) components and dummy components may be prepared. The dummy components may be positioned on the carriers matching those defect units pre-tested on the PCB structure. This approach may allow decreasing the total cost of the electronic packages due to the reduced loss of known-good components. After the combination of PCB structure and embedded core, singularization of the components may be executed. An additional product which can be manufactured according to an exemplary embodiment of the invention is an electronic module based on different combination levels, for instance an embedded core in the middle and two PCB structures, i.e. one on top side and one on bottom side of the embedded core.

According to an exemplary embodiment, the different component-carrier structures may be connected to one another by soft lamination. This may denote the fact that a lamination layer, i.e. a not fully cured layer, may be connected (for instance by partial lamination) to one of the component-carrier structures. Thereafter, the two component-carrier structures may be connected with one another via the soft-lamination layer. More specifically, this may be accomplished by fully curing the previously only partially-cured lamination layer. This may be done by lamination, i.e. the application of thermal energy and/or mechanical pressure to the previously only partially-cured electrically-insulating layer structure between the two component-carrier structures to be connected. In different embodiments, the mentioned soft-lamination process can be applied on either of the PCB structures (for instance to an embedded core). Further combinations of multiple-level component-carrier structures can be realized depending on how many modules shall be combined in a certain application.

Instead of carrying out the soft-lamination procedure for connecting different component-carrier structures to one another, it is also possible according to another exemplary embodiment to print the dielectric-connection layer on the core surface or on the surface of one of the component-carrier structures. Openings may be left in the design which may serve as connection vias. A significant advantage of such an embodiment is the achievement of tighter design rules as compared to laser via formation.

In an embodiment, a chip-last manufacturing architecture may be provided in combination with center-core embedding. By softly laminating a resin sheet on the center-core board of the PCB to be combined with, better design rules can be achieved than with conventional approaches. A chip-last architecture may decrease the waste of components by combining known-good dies with known-good sections or component-carrier units. In particular, chip-last embedding can be carried out highly advantageously or in high-layer boards. Exemplary applications of exemplary embodiments of the invention relate to Wi-Fi modules, Bluetooth modules, radio-frequency power amplifiers, etc.

In particular, an exemplary embodiment of the invention may provide a board-to-board connection-manufacturing architecture combining a pre-tested electronic block (for instance a high-density integration block) of a first component-carrier structure and an embedded core as second component-carrier structure for obtaining substantial advantages in terms of yield and manufacturing effort.

FIG. 1 to FIG. 4 illustrate cross-sectional views of structures obtained during carrying out a method of manufacturing component carriers 100 according to an exemplary embodiment of the invention.

Referring to FIG. 1, a panel type component-carrier structure 104 is shown which is composed of multiple sections 102. Each of the sections 102 corresponds to a portion of the component-carrier structure 104 which forms part of a readily manufactured separate component carrier 100 (compare FIG. 4 and FIG. 5). For example, the component-carrier structure 104 may be a panel or an array comprising multiple preforms of component carriers 100.

As shown, the component-carrier structure 104 comprises a planar-laminated stack 118 comprising for instance a central electrically-insulating layer structure 121 covered on both opposing main surfaces with a respective electrically-conductive layer structure 122. In the shown embodiment, the electrically-insulating layer structure 121 may comprise resin (in particular epoxy resin), optionally comprising reinforcing particles such as glass fibers or glass particles. The electrically-conductive layer structures 122 may for instance be metal layers such as copper foils. Although not shown, it is possible that the stack 118 of the component-carrier structure 104 comprises for example 14-layer structures.

A function test may be carried out for each of multiple sections 102 of the component-carrier structure 104 individually. The sections denoted with reference numeral 102 have successfully passed the functional test, whereas the section denoted with reference numeral 140 has failed the functional test. Thus, FIG. 1 shows a component-carrier structure 104 with multiple sections 102, 140 which have undergone an individual electric test concerning their functioning. The result of this test has been that the sections labelled 102 have passed this functional electric test and can therefore be used for manufacturing functionally-intact component carriers 100. However, the section labelled 140 has failed this electric test and cannot be used as part of a functionally-intact component carrier 100.

Referring to FIG. 2, the component-carrier structure 104 of FIG. 1 is shown together with an attached connection structure 114. Furthermore, FIG. 2 illustrates a further component-carrier structure 106 which is aligned with regard to the component-carrier structure 104. The further component-carrier structure 106 is to be connected with the component-carrier structure 104 by the connection structure 114.

As shown, also the further component-carrier structure 106 comprises a planar-laminated stack 118 comprising for instance a central electrically-insulating layer structure 121 covered on both opposing main surfaces with a respective electrically-conductive layer structure 122. Although not shown, it is possible that the stack 118 of the further component-carrier structure 106 comprises for example 14-layer structures. In the shown embodiment, the electrically-insulating layer structure 121 of the further component-carrier structure 106 may comprise resin (in particular epoxy resin), optionally comprising reinforcing particles such as glass fibers or glass particles. The electrically-conductive layer structures 122 of the further component-carrier structure 106 may for instance be metal layers such as copper foils. More specifically, the further component-carrier structure 106 comprises a core 124 having cavities 126 in which functional components 110 and dummy components 112 are embedded, as described below in detail. The core 124 corresponds to the stack 118 of the further component-carrier structure 106.

To obtain the further component-carrier structure 106 as shown in FIG. 2, functional components 110 are inserted in each, but in no other, of further sections 108 of the further component-carrier structure 106 in such a way that each further section 108 assigned to a respective section 102 having successfully passed the test described referring to FIG. 1 is provided with one of the functional components 110. No functional components 110 are inserted into a further section 108 spatially coinciding with section 140 having failed the section-specific function test described referring to FIG. 1. However, a functionally inactive dummy component 112 is inserted into the cavity 126 of the further section 108 which is to be directly mechanically connected and assigned to the section 140 having failed to pass the test. No dummy components 112 are inserted into further sections 108 corresponding to sections 102 having passed the function test. As with the sections 102 of the component-carrier structure 104, a functional test can also be carried out individually for each of the functional components 110 before inserting the functional components 110 in the cavities 126 of the further component-carrier structure 106. Hence, the functional components 110 are inserted into respective ones of the further sections 108 only if the respective functional component 110 has previously passed the functional tests successfully. As shown in FIG. 2, no functional component 110 is inserted in the further section 108 assigned to section 140 having failed the test. Correspondingly, no dummy components 112 are inserted in each of the further sections 108 assigned to a respective section 102 having successfully passed the test.

As a result of the electric test of the individual sections 102, 140 of the component-carrier structure 104 of FIG. 1, the process of embedding components in the cavities 126 of the further component-carrier structure 106 can be adapted correspondingly. The further sections 108 of the further component-carrier structure 106 which are aligned and therefore assigned to a corresponding section 102 of the component-carrier structure 104 are filled with a known-good functional component 110, i.e., a component having passed a functional test before embedding. Thus, components are classified only as functional components 110 and are considered for embedding in a further section 108 assigned to a known-good section 102, when said component has successfully passed an electric test concerning its electronic functionality. In the shown embodiment, the functional components 110 are semiconductor chips which have successfully passed a corresponding functioning test which may be carried out by a test device (not shown). However, another section 108 of the further component-carrier structure 106 which is spatially and functionally assigned to section labelled 140 of the component-carrier structure 104 which has failed the electric test will only be equipped with a functionally inactive dummy component 112 rather than with a functional component 110. The dummy components 112 may be shaped and dimensioned like the functional components 110 but do not provide the function of the functional components 110. Since the corresponding section 140 is not usable for a component carrier 100, the corresponding section 108 of the further component-carrier structure 106 will also be waste. Therefore, the respective cavity 126 is not filled with an expensive functional component 110 but with an identically shaped and dimensioned, but functionally inactive further dummy component 112. Descriptively speaking, only known-good sections 102 are connected with sections 108 accommodating known-good functional components 110. In contrast to this, known-bad sections 140 of the component-carrier structure 104 are combined with dummy components 112 of the further component-carrier structure 106. Dummy components 112 may be totally inactive space holders, as long as they are shaped and dimensioned as functional components 110. Dummy components 112 may show similar properties (for instance with regard to stability, rigidity or flexibility, surface roughness, thermal behavior, etc.) at the time of the component carrier 100 being fabricated. It may be possible to choose such dummy components 112 with the same properties as described above, but much shorter durability, degradation, easier recyclability, etc., as the dummy components 112 are only needed as space holders and may be optionally recycled afterwards.

As mentioned above, the component-carrier structure 104 is to be connected with the further component-carrier structure 106 by connection structure 114. The connection structure 114 is here embodied as a patterned electrically-insulating layer structure 120 comprising at least partially uncured resin and having an array of recesses filled with an electrically-conductive material 132 in form of copper paste. The connection structure 114 may be formed by printing, as illustrated and described in further detail in FIG. 9 and FIG. 10. Printing the connection structure 114 on the component-carrier structure 104 allows the precise definition of electrically-insulating regions (compare reference numeral 120) and electrically-conductive regions (compare reference numeral 132) of the connection structure 114.

As shown in FIG. 2, each of the functional component 110 comprises electrically-conductive terminals 123 (such as pads) having an exterior non-copper surface connected to the printed-connection structure 114. Thus, the embedded component 110 is not necessarily provided with a copper termination as normally needed for center-core embedding. However, according to an exemplary embodiment of the invention, the contact termination material on component level is not an issue, as paste can be used to interconnect the two component-carrier structures 104, 106. Additional effort involved with conventional PCB processes such as laser drilling, desmearing, electroless copper, etc., which are compatible only with copper-terminated surfaces, may therefore be dispensable.

Referring to FIG. 3, the result of the connection of the component-carrier structures 104, 106 by the connection structure 114 described above is shown as semifinished product 134. This connection can be established by lamination.

The semifinished product 134 comprises the component-carrier structure 104 with the plurality of functional sections 102 and the non-functional section 140. Also, the further component-carrier structure 106, being connected with the component-carrier structure 104, forms part of the semifinished product 134. The functional components 110 are inserted in some of the further sections 108 so that each further section 108 assigned to a respective functional section 102 is provided with one of the functional components 110. A functionally inactive dummy component 112 is inserted in further section 108 being assigned to non-functional section 140 having failed the functional test of the individual sections 102, 140 of the component-carrier structure 104.

The semifinished product 134 shown in FIG. 3 can be obtained by laminating the structures shown in FIG. 2 together, in particular by applying pressure and heat. Thereby, the electrically-insulating layer structure 120 of the connection structure 114 may be cured. For instance, the electrically-insulating layer structure 120 may be previously uncured resin with polymers which cross-link in the presence of heat and pressure. Thereby, the resin becomes fully cured and thereby adheres component-carrier structures 104, 106 to one another. Also, the electrically-conductive material 132, in the shown embodiment a copper paste, may be cured by this lamination procedure. For instance, a solvent in the copper paste may evaporate so that the remaining copper particles are connected to one another by sintering and provide a reliable electric connection between the opposing component carrier structures 104, 106.

The left-hand side of FIG. 3 also illustrates (in contrast to FIG. 1 and FIG. 2) a further feature according to an exemplary embodiment of the invention. The component carrier 100 shown on the left-hand side, which may be formed based on center core embedding, can have component pads or terminals 123 facing directly outside (i.e. without further layer on top). In case the component pads' pitch, d, i.e. the pad center to pad center distance, is too tight (for instance smaller than 300 µm), it is also possible for form one or more redistribution layers (not shown) on top of the terminals 123 to fan out. This may relax the design rules in order to meet a further component-carrier structure.

Referring to FIG. 4, the semifinished product 134 is singularized into multiple functionally active component carriers 100 and a functionally inactive component carrier 100'. Separation lines 199 indicate how the semifinished product 134 according to FIG. 4 is separated into functionally active component carriers 100 and a functionally inactive component carrier 100'. Separation along lines 199 may be accomplished by mechanically cutting, by laser cutting, or by chemical etching.

The component carrier 100' comprising the dummy component 112 may be classified as waste. The component carriers 100 may be operated in accordance with a corresponding application. In view of the combination of known-good sections 102 with known-good functional components 110, the component carriers 100 have a high likelihood of being functionally usable without reliability issues. In contrast to this, in view of the combination of known-bad section 140 with known-bad dummy component 112, the component carrier 100' is functionally inactive and can be classified as waste. Alternatively, the component carrier 100' can be made subject to a recycling procedure, for instance for recovering the dummy component 112 to be used in a subsequent procedure of manufacturing a further batch of component carriers 100.

FIG. 5 illustrates a cross-sectional view of such a component carrier 100 according to an exemplary embodiment of the invention which has been obtained by the manufacturing procedure according to FIG. 1 to FIG. 4. The shown component carrier 100 comprises a component-carrier section 102, a further component-carrier section 108, a functional component 110 embedded in the further component-carrier section 108, and a part of printed and now cured connection structure 114 by which the component-carrier section 102 and the further component-carrier section 102 are connected. FIG. 5 thus shows a component carrier 100 as obtained after the singularization procedure described referring to FIG. 4.

FIG. 6 illustrates a cross-sectional view of a component carrier 100 according to another exemplary embodiment of the invention. In contrast to the manufacturing method described referring to FIG. 1 to FIG. 5, the component carrier 100 according to FIG. 6 comprises an additional procedure during its manufacture. To obtain the component carrier 100 according to FIG. 6, another component-carrier structure 128 (which may be constructed in a similar way as component-carrier structure 104 or a section 102 thereof) is connected with the semifinished product 134 composed of the component-carrier structure 104 and the further component-carrier structure 106 (or a portion thereof). For this additional connection, another connection structure 130 may be used, which can be configured correspondingly to the connection structure 114 shown in FIG. 2 or according to any other embodiment of the connection structure described herein.

Thus, FIG. 6 shows a component carrier 100 according to another exemplary embodiment in which not only two component-carrier structures 104, 106 are interconnected during a batch manufacture of component carriers 100, but another component-carrier structure 128 has been connected to the further component-carrier structure 106 with the embedded-functional components 110. Therefore, a particularly high layer account may be obtained in the component carrier 100 according to FIG. 6 while nevertheless having a high yield. Also, sections of the other component-carrier structure 128 may be connected with sections having functional components 110 only after a successful functioning test of the respective section of the other component-carrier structure 128.

FIG. 7 to FIG. 12 show cross-sectional views of structures obtained during carrying out a method of manufacturing component carriers 100 according to an exemplary embodiment of the invention.

Referring to FIG. 7, the connection structure 114, made of an at least partially uncured material such as not yet cross-linked epoxy resin, is softly laminated on the component-carrier structure 104 or section 102 thereof, so that the connection structure 114 remains at least partially uncured after the laminating. More precisely, this connection of the connection structure 114 to the component-carrier structure 104 or section 102 may involve an only partial cross-linking and hence only partial curing of the material of the electrically-insulating layer structure 120. Such a soft lamination may be accomplished by applying a sufficiently moderate amount of heat and/or a sufficiently moderate amount of pressure. When the amount of supplied heat and/or the amount of applied pressure is limited so that, after the soft lamination, the electrically-insulating layer structure 120 is still at least partially uncured, the soft laminated electrically-insulating layer structure 120 can still be used for interconnection of section 102 with further section 108 in a later lamination procedure (see FIG. 11).

Referring to FIG. 8, a result of the soft-lamination procedure described referring to FIG. 7 is shown. Furthermore, the laminated connection structure 114 has been meanwhile patterned so that surface portions of the upper electrically-conductive layer structure 122 of the component-carrier structure 104 or section 102 is exposed by recesses 131.

FIG. 8 shows the result of a patterning of the electrically-insulating layer structure 120 so as to expose electrically-conductive layer structure 122 on an exterior surface of the component-carrier structure 104 or section 102. Patterning may be accomplished, for example, by laser drilling, optionally in combination with a subsequent dry-etching procedure. Alternatively, the patterning may be carried out by lithography and chemical etching. The patterning and resulting exposure of the electrically-conductive layer structures 122 allows for an electric connection of this now exposed electrically-conductive layer structure 122 with a corresponding electrically-conductive layer structure 122 of the further component-carrier structure 104 or a section 108 thereof (compare FIG. 11 and FIG. 12).

Referring to FIG. 9, an alternative method of forming the connection structure 114 is shown. According to FIG. 9, the connection structure 114 is printed on the component-carrier structure 104 or section 102 in an already patterned way. For instance, this printing may be embodied as a dispensing. For instance, the connection structure 114 may comprise uncured resin (in particular epoxy resin). According to FIG. 9, the printed connection structure 114 may be free of a reinforcing structure, in particular free of reinforcing glass fibers.

Thus, as an alternative to the formation of the connection structure 114 as described referring to FIG. 7 and FIG. 8, FIG. 9 describes how such a connection structure 114 may also be applied by printing. For this purpose, a medium-supply device 197 filled with a medium 195 to be supplied to the component-carrier structure 102 for forming the connection structure 114 may be used. The medium-supply device 197 can be controlled by a control unit 193. As indicated by a double arrow 191, the medium-supply device 197 can be moved along a main surface of the component-carrier structure 104 or the section 102 so as to apply the connection structure 114 in accordance with a desired pattern. Via an injection opening 189 of the medium-supply device 197, medium 195 can be applied to desired surface portions of the component-carrier structure 104 or section 102 to thereby define the patterned-connection structure 114 without carrying out a patterning procedure. With the procedure described referring to FIG. 9, the electrically-insulating layer structure 120 of the connection structure 114 may be formed.

Referring to FIG. 10, electrically-conductive material 132 is printed (for instance dispensed) selectively into the recesses 131 extending through the electrically-insulating layer structure 120 of the connection structure 114.

As shown in FIG. 10, a further medium-supply device 185 may be used for applying an electrically-conductive medium 183 selectively to exposed surface portions of the electrically-conductive layer structure 122. For instance, the medium 183 may be copper paste, which may optionally comprise an evaporable solvent or any other sacrificial material promoting proper application of medium 183. By a controlled movement of the further medium-supply device 185 along the surface of the component-carrier structure 104 or section 102, exposed electrically-conductive portions of the electrically-conductive layer structure 122 may be selectively covered with the electrically conductive material 132.

In the previously described embodiment, in which the electrically-insulating layer structure 120 of the connection structure 114 is applied by soft lamination, exposed portions of the electrically-conductive layer structure 122 shown in FIG. 8 can also be filled with the electrically-conductive paste 132 by the procedure described according to FIG. 10.

Referring to FIG. 11, a subsequent lamination of the component-carrier structure 104 (or the section 102) and the further component-carrier structure 106 (or the section 108) by the connection structure 114 is illustrated.

FIG. 11 illustrates the connection of the component-carrier structure 102 covered with the connection structure 114 shown in FIG. 10 on the one hand and further component-carrier structure 106 on the other hand. This connection may be carried out for example by the application of pressure and/or heat. When the electrically-insulating layer structure 120 of the connection structure 114 has been applied by soft lamination, the component-carrier structure 114 may be fully cured by the additional lamination according to FIG. 11. When the electrically-insulating layer structure 120 of the connection structure 114 has been formed by printing as described referring to FIG. 9, the connection according to FIG. 11 may be carried out by curing the connection structure 114, which can be accomplished as well by mechanical pressure and/or heat.

FIG. 12 shows the result of the complete lamination described referring to FIG. 11. FIG. 12 shows the obtained component carrier 100. When the procedure of FIG. 7 to FIG. 12 is carried out on batch level, i.e. by processing and connecting component-carrier structures 104, 106 rather than sections 102, 108, a semifinished product 134 is obtained which still needs to be singularized (for instance in the way shown in FIG. 4) to obtain individual component carriers 100.

FIG. 13, FIG. 14, and FIG. 15 show cross-sectional views of component-carrier structures 104, 106 connected during carrying out a method of manufacturing component carriers 100 according to an exemplary embodiment of the invention. FIG. 13 to FIG. 15 show that the manufacturing process described referring to FIG. 7 to FIG. 12 can be carried out in a corresponding way also with multiple integrally-formed component-carrier structures 104, 106, i.e., on a panel or an array level. Furthermore, two functional components 110 are embedded in each obtained component carrier 100, and two dummy components 112 are embedded in each obtained non-functional component carrier 100'.

Although not shown in the figures, the component-carrier structures 104 and 106 can also be without components 110 when being connected. This is especially applicable in the case of highly-complex panel structures (for instance many layers) for reducing a bad card/bad unit multiplicator. In that case, all units or sections 102, 108 of both component-carrier structures 104, 106 can be tested prior to connecting them with one another. In that case, it may be possible to singularize and reconstruct one of the component-carrier structures 104 or 106 to adjust it to the locations of the known-good units or sections 102, 108 of the respective other component-carrier structure 104 or 106.

The latter mentioned embodiment of the invention can be described more generally in the following way. A method of manufacturing component carriers (100), wherein the method comprises: carrying out a test for each of multiple sections (102, 140) of a component-carrier structure (104); carrying out a test for each of multiple sections (108) of a separate further component-carrier structure (108); connecting a respective one of said sections (102), having successfully passed the test, with a respective one of said further sections (108) having successfully passed the test; if at least one section (140, 108) has failed the test, rejecting said at least one section (140, 108). All features described herein and not being related to the embedding of components (110) can be applied to this method as well.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing component carriers on panel level, comprising:
   carrying out a test for each of multiple sections of a component-carrier structure,
   wherein the component-carrier structure is a panel or an array comprising multiple preforms of component carriers;
   providing a further component-carrier structure comprising a core having a plurality of further sections, each further section comprising a cavity;
   assigning each further section of the core of the further component-carrier structure either to a respective section of the component-carrier structure having successfully passed the test or to a respective section of the component-carrier structure having failed the test
   inserting at least one functional component in the cavity of a respective further section of the further component-carrier structure assigned to a respective section having successfully passed the test;
   inserting at least one functionally inactive dummy component in the cavity of a respective further section assigned to a respective section having failed the test; and
   connecting the further component-carrier structure comprising the at least one functional component and the at least one functionally inactive dummy component with the component-carrier structure by a connection structure.

2. The method according to claim 1, further comprising at least one of the following features:
   wherein the method comprises forming at least part of the connection structure on at least one of the component-carrier structure and the further component-carrier structure by additive manufacturing;
   wherein the method comprises laminating the connection structure, comprising an at least partially uncured material, on at least one of the component-carrier structure and the further component-carrier structure so that the connection structure remains at least partially uncured after the laminating; and subsequently laminating together, by the connection structure, the component-carrier structure and the further component-carrier structure, wherein the method comprises substantially fully curing the connection structure by the subsequent lamination;
   wherein the method comprises connecting another component-carrier structure with the component-carrier structure and the further component-carrier structure by another connection structure, so that the further component-carrier structure is arranged between the component-carrier structure and the other component-carrier structure;
   wherein the method comprises separating a semifinished product obtained by connecting the component-carrier structure with the further component-carrier structure into individual component carriers each comprising a section, a further section, a portion of the connection structure, and one of at least one functional component or at least one dummy component;

wherein the method comprises providing the connection structure as a patterned electrically-insulating layer structure comprising at least partially uncured resin having at least one recess filled with an electrically-conductive material.

3. The method according to claim 1, further comprising at least one of the following features:
   wherein the method comprises treating one or more component carriers comprising a dummy component as waste;
   wherein the method comprises: carrying out a test for each of the functional components before the inserting; and inserting only those of the functional components in a respective one of the further sections which functional components have successfully passed the test;
   wherein each of the component-carrier structure and the further component-carrier structure comprises a stack comprising at least one electrically-insulating layer structure and/or at least one electrically-conductive layer structure, wherein the stack of at least one of the component-carrier structure and the further component-carrier structure comprises at least 6 layer structures.

4. The method according to claim 1, wherein no functional components are inserted in each of the further sections assigned to a respective section having failed the test and/or no dummy component are inserted in each of the further sections assigned to a respective section having successfully passed the test.

5. A computer-readable medium, in which a computer program of manufacturing component carriers is stored, which computer program, when being executed by one or a plurality of processors, is adapted to carry out or control a method, comprising:
   carrying out a test for each of multiple sections of a component-carrier structure being a panel with preforms of component carriers;
   assigning a cavity of a further section of a core of a further component-carrier structure having a plurality of further sections to a respective section of the component-carrier structure having successfully passed the test or to a respective section of the component-carrier structure having failed the test;
   inserting at least one functional component in the cavity of a respective further section of the further component-carrier structure assigned to a respective section having successfully passed the test;
   inserting at least one functionally inactive dummy component in the cavity of a respective further section assigned to a respective section having failed the test; and
   connecting the further component-carrier structure comprising the at least one functional component and the at least one functionally inactive dummy component with the component-carrier structure by a connection structure.

6. A program element of manufacturing component carriers, which program element, when being executed by one or a plurality of processors, is adapted to carry out or control a method, comprising:
   carrying out a test for each of multiple sections of a component-carrier structure being a panel with preforms of component carriers;
   assigning a cavity of a further section of a core of a further component-carrier structure having a plurality of further sections to a respective section of the component-carrier structure having successfully passed the test or to a respective section of the component-carrier structure having failed the test;
   inserting at least one functional component in the cavity of a respective further section of the further component-carrier structure assigned to a respective section having successfully passed the test;
   inserting at least one functionally inactive dummy component in the cavity of a respective further section assigned to a respective section having failed the test; and
   connecting the further component-carrier structure comprising the at least one functional component and the at least one functionally inactive dummy component with the component-carrier structure by a connection structure.

7. The method of claim 1, further comprising:
   providing the component-carrier section of the component-carrier structure and the further component-carrier section of a further component-carrier structure being separate from said component-carrier structure;
   additively manufacturing a connection structure on at least one of the component-carrier section and the further component-carrier section; and
   connecting the component-carrier structure with the further component-carrier structure so that the component-carrier section and the further component-carrier section are connected by the additively manufactured connection structure.

8. A method of manufacturing component carriers on a panel level, the method comprising:
   carrying out a test for each of multiple sections of a component-carrier structure being a panel with preforms of component carriers;
   providing a further component-carrier structure comprising a core having a plurality of further sections, each further section comprising a cavity;
   assigning each further section of the core of the further component-carrier structure either to a respective section of the component-carrier structure having successfully passed the test or to a respective section of the component-carrier structure having failed the test;
   inserting at least one functional component in the cavity of a respective further section of the further component-carrier structure assigned to a respective section having successfully passed the test;
   inserting at least one functionally inactive dummy component in the cavity of a respective further section assigned to a respective section having failed the test;
   connecting the further component-carrier structure with the at least one functional component and the at least one functionally inactive dummy component with the component carrier structure by a connection structure; and
   providing the connection structure as a patterned electrically insulating layer structure comprising an at least partially uncured B-stage resin sheet having at least one recess filled with an electrically conductive material.

* * * * *